(12) United States Patent
Lou (10) Patent No.: US 7,409,417 B2
(45) Date of Patent: Aug. 5, 2008

(54) POLYPHASE FILTER WITH OPTIMIZED SILICON AREA

(75) Inventor: Wenkwei Lou, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 699 days.

(21) Appl. No.: 10/852,282

(22) Filed: May 24, 2004

(65) Prior Publication Data

US 2005/0262176 A1 Nov. 24, 2005

(51) Int. Cl.
*G06F 17/10* (2006.01)
(52) U.S. Cl. ..................... 708/316; 708/319
(58) Field of Classification Search ............ 708/316, 708/319, 300
See application file for complete search history.

(56) References Cited

U.S. PATENT DOCUMENTS

| 4,483,009 A | * | 11/1984 | Honda et al. | 375/232 |
| 5,956,262 A | * | 9/1999 | Comminges et al. | 708/319 |
| 6,600,495 B1 | * | 7/2003 | Boland et al. | 345/660 |
| 2003/0177157 A1 | * | 9/2003 | Matoba | 708/316 |

* cited by examiner

*Primary Examiner*—Tan V. Mai (57) ABSTRACT

A polyphase filter including M taps, each of the M taps including a filter coefficient. The filter also includes a multiplier-accumulator (MAC) shared by the M taps, a plurality of multiplexors for sequentially selecting a subset of the plurality of taps, and a scheduler for controlling the MAC to perform arithmetic operations on respective filter coefficients of the selected subset of the plurality of taps.

11 Claims, 6 Drawing Sheets

POLYPHASE FILTER WITH OPTIMIZED SILICON AREA

FIELD OF THE INVENTION

The present invention relates generally to digital signal processing; and more particularly to an area-efficient polyphase filter.

BACKGROUND OF THE INVENTION

In some digital signal processing systems, sample rate converters are used to effect a scaling of a digitally encoded video or audio signal, for example. A digitally encoded video or audio signal, includes an array of samples of the original signal. A decimator is used to remove sample values, if the signal is being down-converted. An interpolator is used to add sample values if the signal is being up-converted. To provide both up-scaling and down-scaling, the sample rate converters of some digital signal processing systems include both a decimator and an interpolator.

Decimators and interpolators are typically designed as part of digital filters. In this case, the resultant sample value is a weighted average of the samples in the vicinity of the sample. The number of samples used to determine the resultant weighted average is termed the number of "taps" of the digital filter. The general equation for an N-tap filter is given by:

$$y(i+p) = \sum_{n=0}^{N-1} c(n, p) * x(i-n).$$

where $x(i) \ldots x(i-(N-1))$ are the input samples at each tap of the N-tap filter, p is the phase, and c(n, p) is the weight associated with each input sample at the specified phase. a polyphase filter can be utilized to supply a variety of scale factors. Each phase of a P-polyphase filter corresponds to an integer multiple of 1/P of the output scale for down-sampling. Similarly, each phase of a P-polyphase filter corresponds to an integer multiple of 1/P of the input scale for up-sampling.

Figure 1:
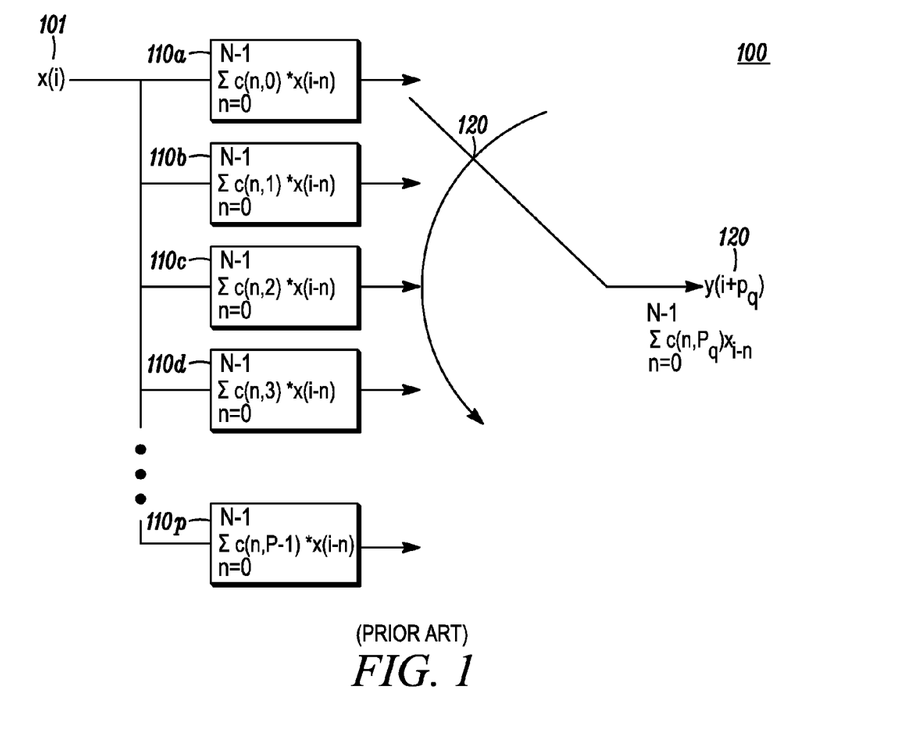
FIG. 1 is simplified block diagram of a typical up-sampling polyphase filter.

FIG. 1 shows a simplified block diagram of an up-sampling polyphase filter with P phase stages 110a-110p. Input samples 101 are input to each stage. If the output is an up-scaling by a factor of 1:P, the output of each stage 110a-110p is selected by switch 120, and P output values are provided in response to each input sample 101. After generating the P output values, the next input sample 101 is input, and another P outputs are generated. As a result, P output values are formed for each input sample, thereby providing an up-scaling by a factor of 1:P. For an up-scaling of Q:P, Q of the P stages are selected for output for each input sample. For example, if Q is three, every third stage 101a, 101d, etc. is selected for output for each input sample.

Figure 2:
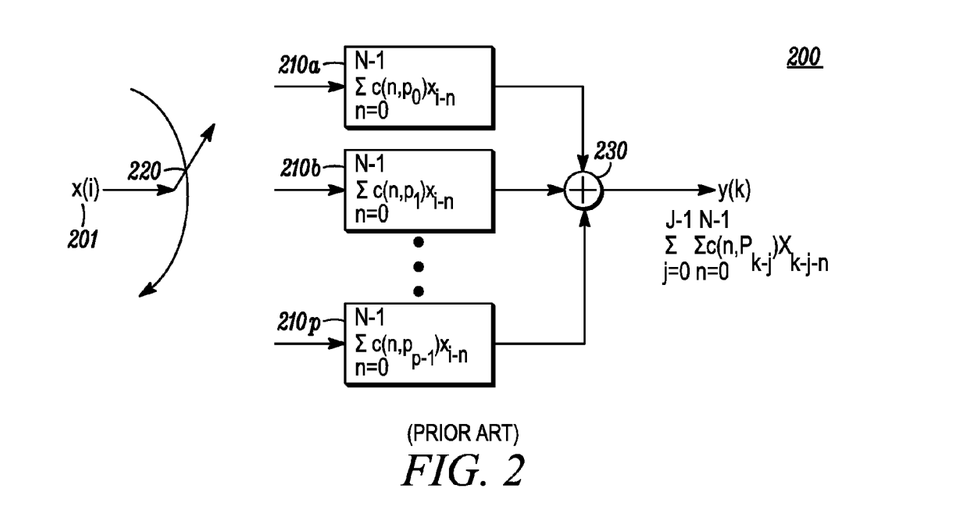
FIG. 2 is simplified block diagram of a typical down-sampling polyphase filter.

FIG. 2 depicts a simplified block diagram of a down-sampling polyphase filter with P phase stages 210a-210p. Input samples 201 are input to select stages via the switch 220. If the output is a downscaling by a factor of P:1, the output of all P stages 210a-p are combined by the adder 230, and a single output value 231 is generated in response to the P input samples 201. After generating the output value, another set of P inputs 201 generate the next output sample 231. As a result, one output value is formed for P input samples, thereby providing a downscaling by a factor of P:1. For a downscaling of Q:1, Q input samples 201 are input to select input stages 210a-210p and the output of these stages are combined by the adder 230 to produce the single output sample 231.

Polyphase filters are typically used to implement decimation and interpolation in a flexible yet computationally efficient way. A polyphase filter with N taps is typically designed as a single filter with N registers and some type of memory that is configured to store the N coefficients for each of the P stages. The N registers of the filter store the corresponding N coefficients for generating each required output.

In the traditional approaches, the decimation/interpolation filters are at a higher sample rate, that is, either before down-sampling or after up-sampling. Given that the down/up sampling ratio is Q, a polyphase filter structure splits the relating filtering into Q parallel stages operating at the lower sampling rate. In applications requiring very high operation speeds, this can be a crucial benefit. Furthermore, the polyphase structures are quite flexible if used, for example, in channelization applications.

However, as shown, typical up/down-scaling polyphase filters require N multipliers and M adders. A typical multiplier takes a significant amount of silicon area to implement in an Integrated Circuit (IC). For example, a typical size for a 22 bit multiplier implemented in 0.13 um CMOS technology is about 21,000 Sq. Microns. Likewise, a typical size for a 22 bit adder using a similar technology is about 670 Sq. Microns. As more complex functions are being integrated in a single IC, silicon area becomes an important consideration and limitation in designing such complex ICs.

Therefore, there is a need for an area-efficient polyphase filter for reducing expensive silicon area.

SUMMARY OF THE INVENTION

The present invention provides an improved method and apparatus for implementing an area-efficient polyphase filter with a substantial reduction is the number of multipliers and adders.

In one embodiment, the present invention is directed to a method for implementing a polyphase filter having M taps, each of the M taps including a filter coefficient. The method comprises sharing a multiplier-accumulator (MAC) by the M taps; sequentially selecting a subset of the M taps; controlling the MAC for performing arithmetic operations on respective filter coefficients of the selected subset of the M taps according to a desired filtering operation; and outputting a signal having the desired filtering operation performed thereon.

In another embodiment, the present invention is directed to a method for filtering a digital input signal. The method comprises configuring M filter taps to share a MAC; sequentially selecting one or more of a plurality of multiplicands; controlling the MAC for performing multiplication operations on the digital input signal with the selected one or more of the plurality of multiplicands; sequentially selecting a subset of the M taps; and controlling the MAC for performing arithmetic operations on respective contents of the selected subset of the M taps.

In yet another embodiment, the present invention is directed to a polyphase filter comprising: a plurality of taps, each of the plurality of taps including a filter coefficient; a MAC shared by the plurality of taps; a plurality of multiplexors for sequentially selecting a subset of the plurality of taps; and a scheduler for controlling the MAC to perform arithmetic operations on respective filter coefficients of the selected subset of the plurality of taps.

BRIEF DESCRIPTION OF THE DRAWINGS

FIG. 5b depicts values for Xn, R0, and the delay taps of the polyphase filter of FIG. 5a;

DETAILED DESCRIPTION

In one embodiment, the present invention is directed to a method and apparatus for implementing an area-efficient polyphase filter used in digital signal processing methods and systems. The area-efficient polyphase filter performs the same filtering operations and produces the same results as conventional polyphase filters with a substantially less number of multipliers and adders required by the conventional polyphase filters. In one embodiment, the area-efficient polyphase filter of the present invention requires a single Multiplier and Accumulator (MAC).

Figure 3:
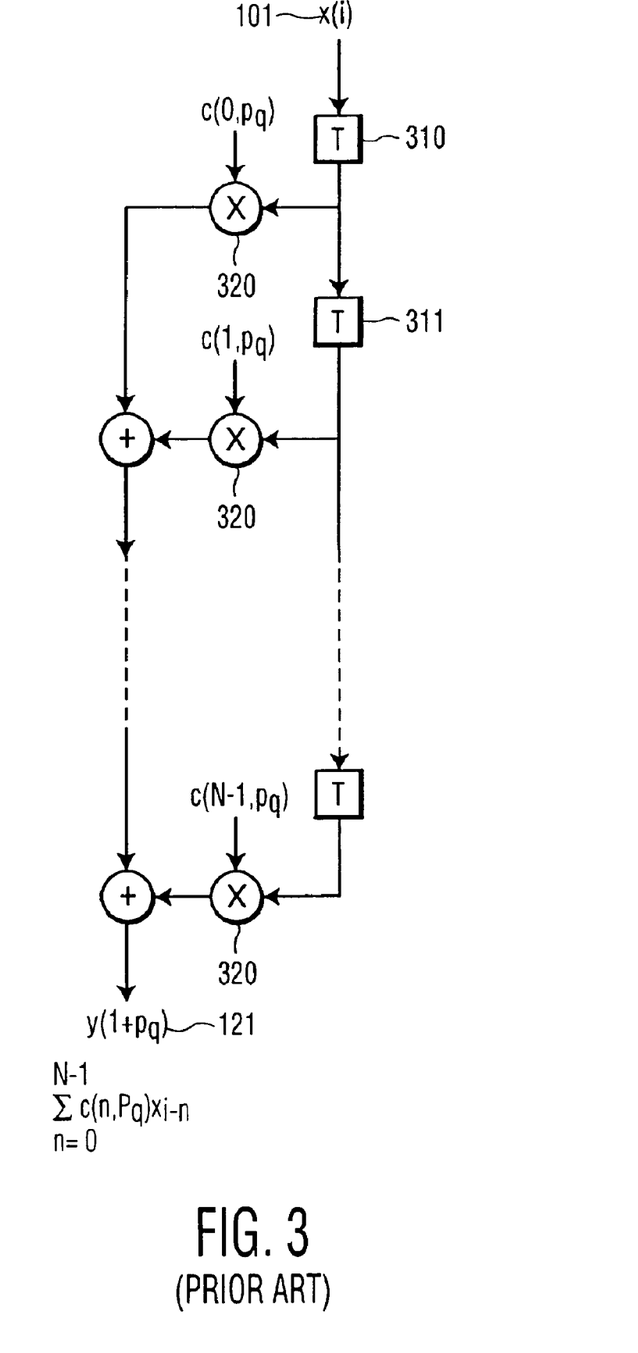
FIG. 3 illustrates a typical up-scaling polyphase filter.

FIG. 3 illustrates a typical up-scaling polyphase filter. As shown, each input sample x(i) 101 is sequentially clocked into the first polyphase delay elements 310. For each output sample y 121, the appropriate coefficient $c(n, p_q)$ is applied to the multipliers 320, where $p_q$ is the phase delay corresponding to the particular phase of the polyphase filter for each output sample y 121. After each of the upscaled samples y 121 are generated, the next input sample x(i) 101 is clocked into the first polyphase delay element 310, while the prior x(i) sample is clocked on to the next delay element 311. The above filtering is then repeated for the next input sample x(i).

Figure 4:
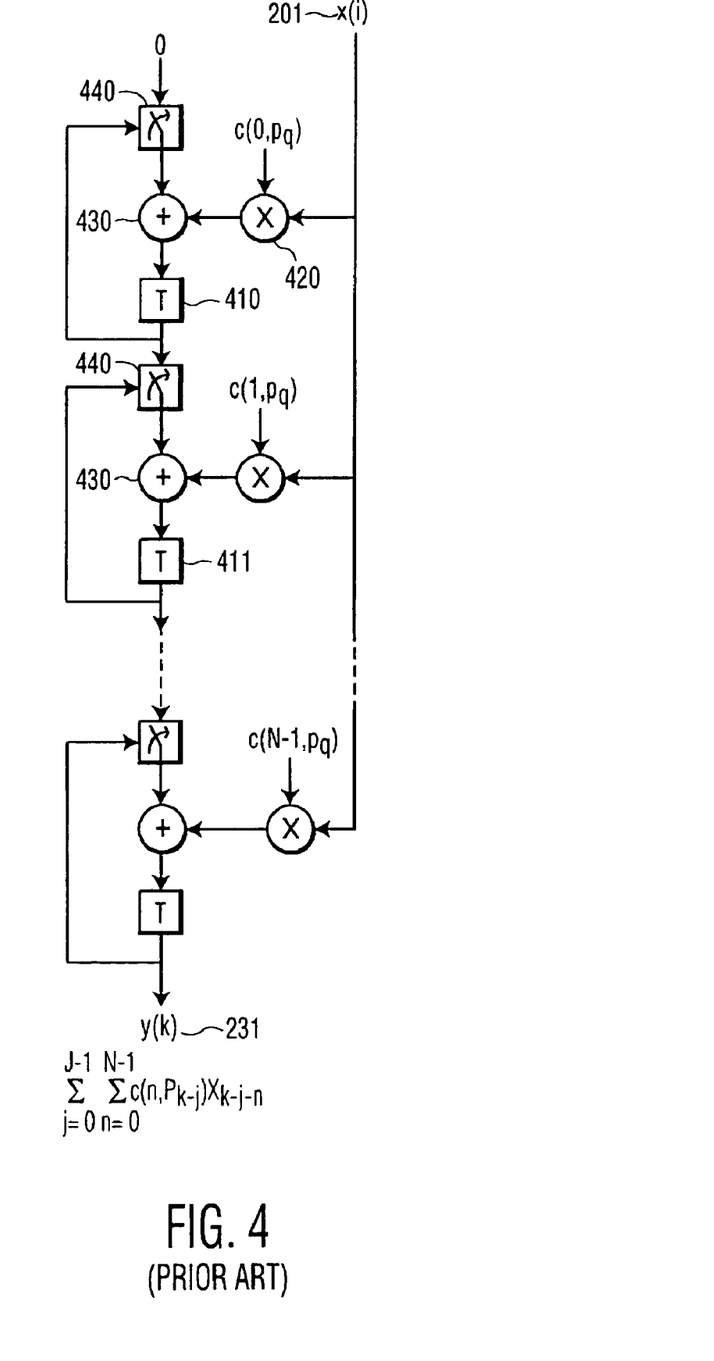
FIG. 4 illustrates a typical down-scaling polyphase filter.

FIG. 4 depicts a typical down-scaling polyphase filter. As shown, each input sample x(i) 201 is multiplied by the appropriate coefficient $c(n, p_q)$, and an intermediate sum is accumulated in the corresponding delay element 410, 411, etc. by setting the switches 440 to effect a loop of the contents of the delay element through the adder 430. Switch 440 is set to cause a transfer of the contents of each delay elements on to the next delay element via the adder 430 that adds the appropriate $c(n, p_q)*x(i)$ to the accumulated sum that is transferred to the next delay element, when the Qth input x(i) 201 arrives in a Q:1 downscaling.

Figure 5A:
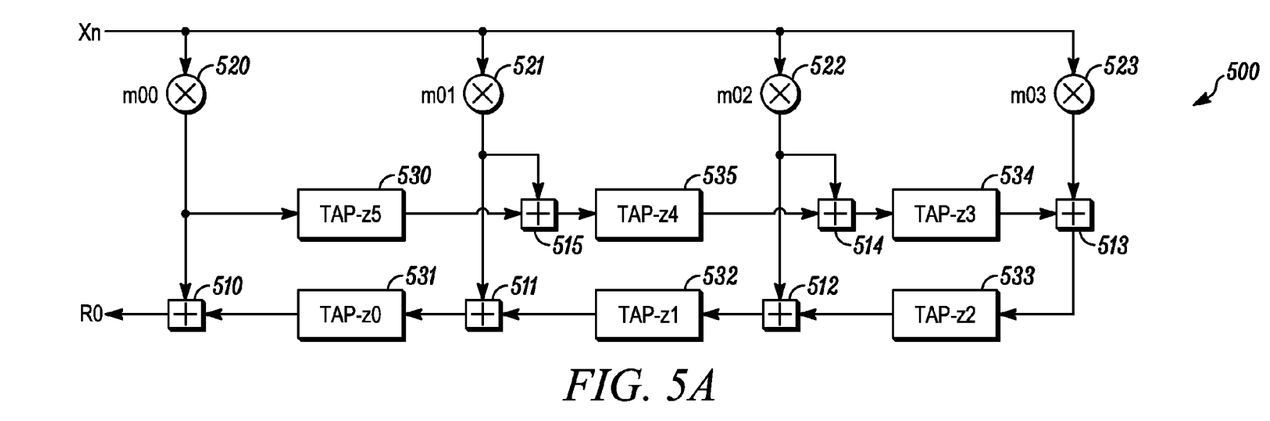
FIG. 5a is an exemplary block diagram of a six-tap polyphase filter.

FIG. 5a is an exemplary block diagram of a six-tap polyphase filter 500. As shown, there are six multiplication and ten addition operations to be completed in each sample time. In operation, four multipliers 520-523 multiply each input data sample (x.sub.n) by a respective multiplicand m00-m03. Each of the tap delays (taps) 530-535 delays its respective data by one clock cycle and adders 510-515 add the data present at their two input terminals. It is noted that while the operation of the polyphase filter 500 is clocked, multipliers 520-523 and adders 510-515 are designed with combinatorial logic. Thus, their operation is not clocked and the results of multiplication and addition operations are ready at each respective output of the multipliers 520-523 and adders 510-515 after a relatively short delay.

Figure 5B:
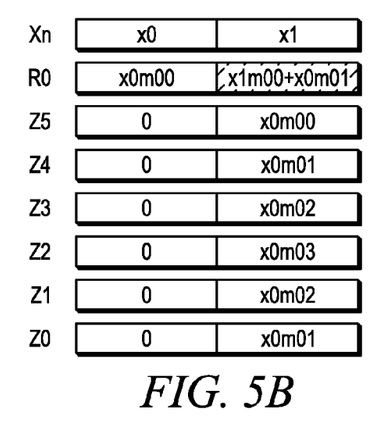

FIG. 5b depicts values for Xn, R0, and the delay taps 530-535 (i.e., tap-z0-tap-z5), for each clock cycle. At time 0 (beginning of the first clock cycle), initial values for all taps 530-535 are zero. x0 is multiplied by m00 (by the multiplier 520) and the result is added (by adder 510) to the output of tap 531 (tap-z0), which has an initial value of zero. The output of the adder 510 is then outputted as R0. Since the multipliers 520-523 and adders 510-515 are combinatorial logic, a value of (x0m00) for R0 is present at R0 before the next clock cycle. At the same time, x0 is also multiplied by m01, m02, and m03 (using multipliers 521, 522, and 523, respectively). The result of x0m01 is then fed to the adder 511 to be added to the output of tap-z1 (initially zero). Thus a value of x0m01 is present at the input of the tap-z0 at the end of the first clock cycle. Similarly, values of x0m01, x0m02, and x0m03 are present at the inputs of the taps 535, 532, 534, and 533 at the end of the first clock cycle, respectively.

At time 1 (beginning of the second clock cycle), X1 is multiplied by m00 (by the multiplier 520) and the result is added (by adder 510) to the output of tap-z0, that is x0m01. The output of the adder 510 (x1m00+x0m01) is then outputted as R0. At this time, the values of the taps z0-z5 are x0m01, x0m02, x0m03, x0m02, x0m01, and x0m00, respectively. These values of the taps z0-z5 are then propagated and added to the results of x01 multiplied by a respective multiplicand m00-m03. The outputs of the adders are then present at the inputs of the taps 535 & 532, 534, and 533 at the end of the second clock cycle. In this manner, polyphase filter 500, performs filtering operation on a stream of data samples (x0 . . . xn), in each clock cycle.

As mentioned above, the four multipliers 520-523 take a significant amount of silicon area. However, the present invention provides an efficient way to share a single Multiplier and Accumulator (MAC) in a polyphase filter. This new scheme saves substantial silicon area, resulting in substantial lower cost.

Figure 6:
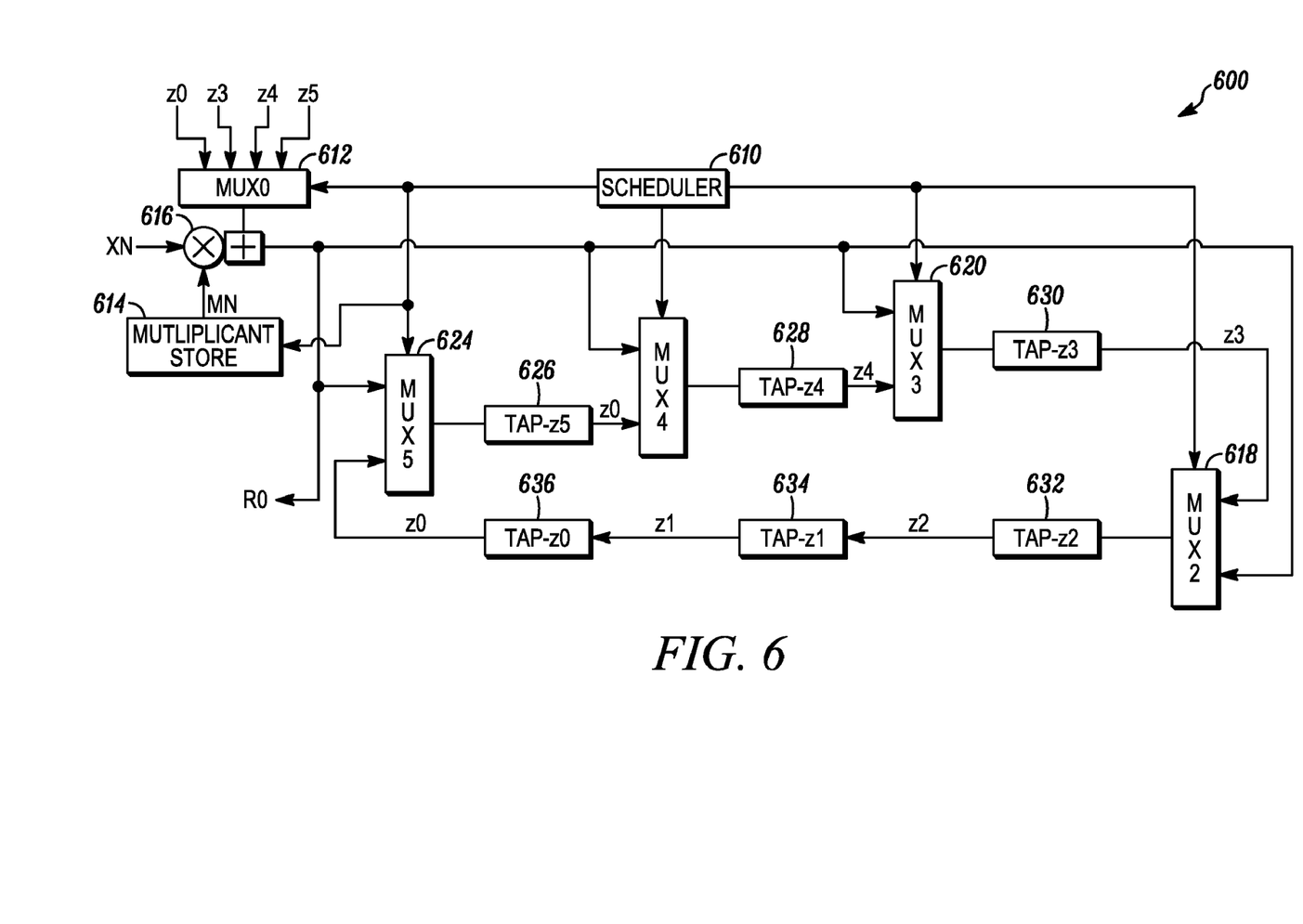
FIG. 6 is an exemplary block diagram of an area-efficient polyphase filter, according to one embodiment of the present invention.

FIG. 6 is an exemplary block diagram of an area-efficient polyphase filter 600, according to one embodiment of the present invention. The area-efficient polyphase filter 600 performs the same filtering operation on the input data and produces the same results as the polyphase filter 500 of FIG. 5. However, the area-efficient polyphase filter 600 requires only one MAC that is, one multiplier and one adder, instead of four multipliers and six adders need by the polyphase filter 500.

As shown in FIG. 6, there are six taps (z0, z1, z2, z3, z4, z5), designated as reference numerals 626, 628, 630, 632, 634, and 636, respectively. The outputs of z0, z3, z4, and z5 taps are fed to the multiplexer 612 (MUX 0). Scheduler 610 controls MUX0 to select the appropriate tap in each clock cycle. The multiplicands for MAC 616 (i.e., m00-m03, in this case) are stored in register 614. A respective multiplicand is fetched by the scheduler 610 and along with the data string Xn is fed to the MAC 616. The scheduler 610 operates the MAC and the timing of the polyphase filter 600 to produce the same results (R0) as the polyphase filter 500 of FIG. 5.

Figure 7:
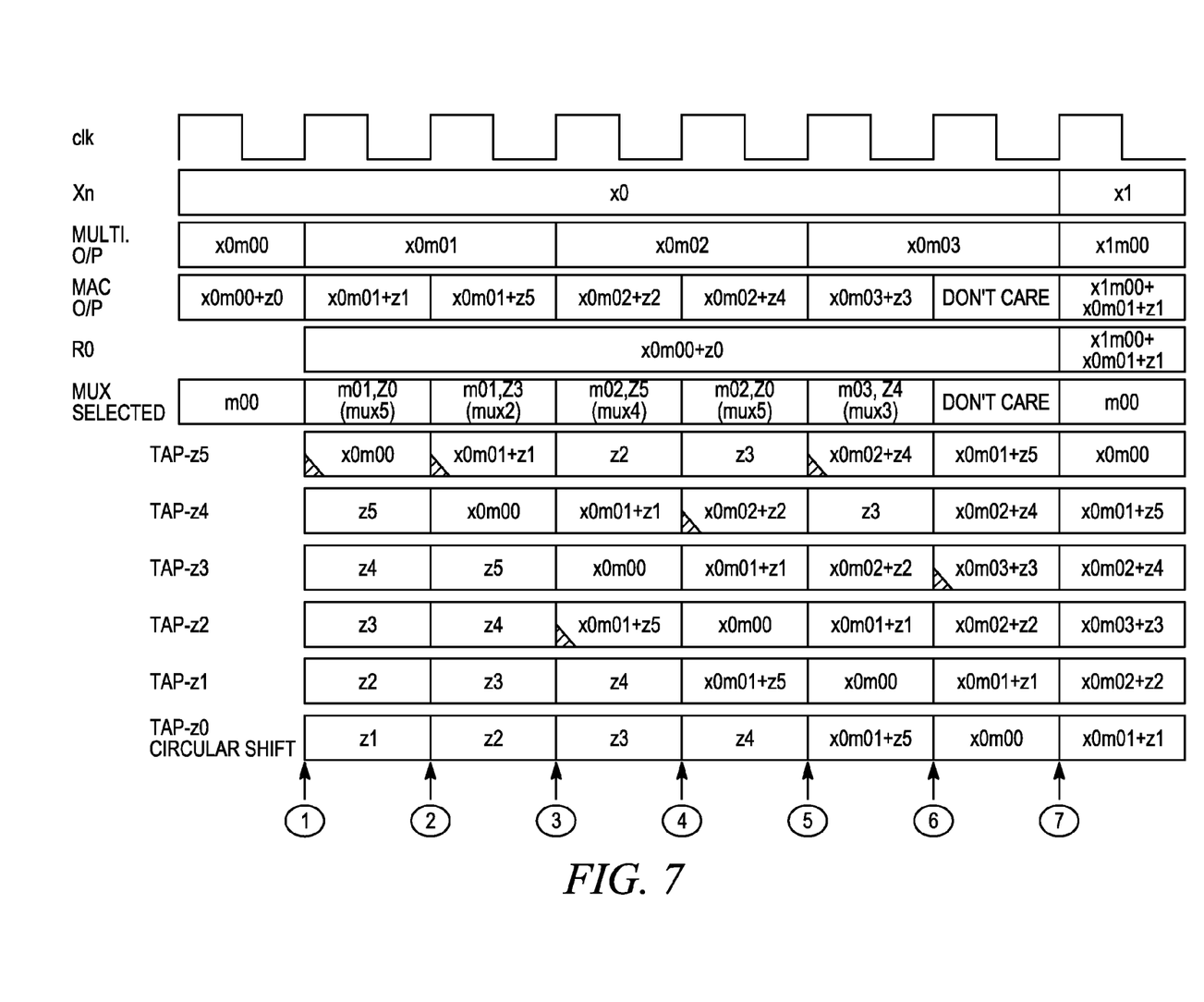
FIG. 7 is an exemplary timing diagram of the area-efficient polyphase filter of FIG. 6.

FIG. 7 is an exemplary timing diagram of the area-efficient polyphase filter of FIG. 6. FIG. 7 also shows the values for multiplication results, R0, and the filter taps z0-z5. At time 0, scheduler 610 selects multiplicand m00 from register 614 and MAC 616 multiplies the selected m00 by x0. As shown, the multiplication results are present for two clock cycles. (shown at the bottom of FIG. 7), MUX5 (624) is selected by the scheduler 610 and the value x0m00 is shifted to tap-z5 626. The shaded triangular areas shown in the taps of FIG. 7 indicate that the result of an arithmetic operation has been shifted to that particular filter tap. At this shift, scheduler 610 now selects multiplicand m01 from register 614 and MAC 616 multiplies the selected m01 by x0. Generally, at each clock cycle, the results in each of the filter taps are shifted to the next tap. However, if there is a multiplexer, depending on the operation of the filter, either the output of the previous tap, or the output of the MAC 616 is selected by a respective multiplexer that is controlled by the scheduler 610.

At shift 2, the multiplication result x0m01 is added to z1 (which was the content of tap z0, selected by MUX0 as an input to the MAC), and the result is shifted to tap z5. At shift 3, z2 which was the content of tap-z0 is shifted to tap-z5, and (x0m01+z1) which was the content of tap-z5 is shifted to tap-z4, etc. x0 is now multiplied by m02 (selected by scheduler) and the result (x0m02) is made present at the output of the MAC. At shift 4, x0m02 is added to z2 (which was previously the content of tap-z5, selected by MUX0 as an input to the MAC) and the result is shifted to tap-z4 via selected MUX4.

At shift 5, the sum of the output of the (previous) tap-z0 (that is, z4) and the multiplication result of x0m02 (already present at the output of the MAC) are shifted into tap-z5 and tap-z3, the output of the (previous) tap-z5 is shifted to tap-z4, and so on. Also, x0 is multiplied by m03 (selected by scheduler) and the result (x0m03) is present at the output of the MAC. At shift 6, the multiplication value (x0m03) is added to z3 (which is the content of tap-z4 at this time, selected by MUX0 as an input to the MAC), and the result (x0m03+z3) is shifted to tap-z3 by MUX3. A circular shift is performed on the other filter taps at this shift, shifting the contents of the previous taps to the next proceeding tap. At shift 7, a circular shift is performed on all of the filter taps, shifting the contents of each respective previous tap to the next proceeding tap, and outputting the filter results for R0, while the next input sample (x1) is made available at the input.

As described above, after seven clock operations (shifts), the area-efficient polyphase 600 produces the same results as the polyphase filter 500, for R0. The time to produce the desired result is slower in the area-efficient polyphase filter 600, because only one MAC is shared between all of the filter taps and only one arithmetic operation can be performed by the MAC in each clock cycle, as shown by the shaded triangular areas in FIG. 7. The area/speed tradeoff of polyphase filter 600 is desirable for low speed or when an already high speed clock is available, and for high chip density applications.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method comprising:
sharing a multiplier-accumulator (MAC) by-a plurality of circularly cascaded taps, wherein each of the plurality of taps includes a filter coefficient;
sequentially selecting a subset of the plurality of taps;
controlling the MAC for performing arithmetic operations on respective filter coefficients of the selected subset of the plurality of taps according to a desired filtering operation; and
outputting a signal having the desired filtering operation performed thereon.

2. The method of claim 1, further comprising:
storing a plurality of multiplicands; and
selecting one or more of the plurality of multiplicands;
inputting the selected one or more of the plurality of multiplicands to the MAC for performing multiplication operations on the selected filter coefficients, responsive to the desired filtering operation.

3. A polyphase filter comprising:
a plurality of circularly cascaded taps, each of the plurality of taps including a filter coefficient;
a multiplier-accumulator (MAC) shared by the plurality of taps;
a plurality of multiplexers for sequentially selecting a subset of the plurality of taps; and
a scheduler for controlling the MAC to perform arithmetic operations on respective filter coefficients of the selected subset of the plurality of taps.

4. The polyphase filter of claim 3, further comprising:
a register for storing a plurality of multiplicands; and
a MAC- multiplexer for selecting one or more of the plurality of multiplicands and inputting the selected one or more of the plurality of multiplicands to the MAC.

5. A method for filtering a digital input signal, the method comprising:
configuring M circularly cascaded filter taps to share a multiplier-accumulator (MAC);
sequentially selecting one or more of a plurality of multiplicands;
controlling the MAC for performing multiplication operations on the digital input signal with the selected one or more of the plurality of multiplicands;
sequentially selecting a subset of the M taps; and
controlling the MAC for performing arithmetic operations on respective contents of the selected subset of the M taps.

6. A filter comprising:
a shared multiplier-accumulator (MAC) configured to produce a resultant signal by performing arithmetic operations on an input signal according to a desired filtering operation;
a circular shift register including:
a first plurality of cascaded taps, wherein each tap is configured to store data samples of an intermediate signal,
a second plurality of cascaded taps, wherein each tap is configured to store a data sample that is either a data sample of the intermediate signal from a previous tap of the circular shift register or the result of the arithmetic operations performed by the shared MAC; and
a scheduler configured to select a filtering coefficient and a data sample from one of the second portion of cascaded taps to be used by the shared MAC when performing arithmetic operations.

7. The filter of claim 6, wherein the shared MAC is further configured to:
multiply the input signal by the selected filtering coefficient, and
add the result of the multiplication to the selected data sample from one of the second portion of cascaded taps.

8. The filter of claim 6, further comprising a memory configured to store a plurality of filtering coefficients; and
wherein the scheduler is configured to select the filtering coefficient from the plurality of filtering coefficients.

9. The filter of claim 6, wherein each of the second plurality of cascaded taps includes:
a current tap configured to store data; and
a multiplexer configured to:

select between the data stored by the current tap and the result of the arithmetic operations performed by the shared MAC, and provide the selected data to the next tap of the circular shift register.

10. The filter of claim 9, wherein the scheduler is configured to control the multiplexer of each of the second plurality of cascaded taps.

11. The filter of claim 6, further comprising a tap multiplexer configured to provide a data sample from one of the second portion of cascaded taps to be used by the shared MAC when performing arithmetic operations; and wherein the scheduler is configured to control which data sample is provided by the tap multiplexer to the shared MAC.

* * * * *